United States Patent [19]
Sodickson

[11] Patent Number: 5,910,728
[45] Date of Patent: Jun. 8, 1999

[54] SIMULTANEOUS ACQUISITION OF SPATIAL HARMONICS (SMASH): ULTRA-FAST IMAGING WITH RADIOFREQUENCY COIL ARRAYS

[75] Inventor: Daniel Kevin Sodickson, Cambridge, Mass.

[73] Assignee: Beth Israel Deaconess Medical Center, Boston, Mass.

[21] Appl. No.: 08/746,358

[22] Filed: Nov. 12, 1996

[51] Int. Cl.$^6$ .................................................. G01R 33/20
[52] U.S. Cl. ............................................................ 324/309
[58] Field of Search .................................. 324/300, 307, 324/309, 318; 128/653.2–653.4; 600/410

[56] References Cited

U.S. PATENT DOCUMENTS

| | | | |
|---|---|---|---|
| 4,825,162 | 4/1989 | Roemer et al. | 324/309 |
| 4,857,846 | 8/1989 | Carlson | 324/309 |
| 5,208,534 | 5/1993 | Okamoto et al. | 324/309 |
| 5,374,890 | 12/1994 | Zou et al. | 324/318 |
| 5,469,060 | 11/1995 | Meyerand | 324/309 |

FOREIGN PATENT DOCUMENTS

| | | |
|---|---|---|
| 0472390 | 2/1992 | European Pat. Off. . |
| 0513987 | 11/1992 | European Pat. Off. . |

OTHER PUBLICATIONS

Carlson, J.W. and Minemura, T., "Imaging Time Reduction Through Multiple Receiver Coil Data Acquisition and Image Reconstruction," *MRM*, vol. 29, 681–688 (1993).

Hutchinson, M. and Raff, U., "Communications: Fast MRI Data Acquisition Using Multiple Detectors," *Magnetic Resonance in Medicine*, vol. 6, 87–91 (1988).

Kwiat, D. and Einav, S., "A Decoupled Coil Detector Array for Fast Image Acquisition in Magnetic Resonance Imaging," *Med. Phys.*, vol. 18, No. 2, 251–265 (1991).

Kwiat, D. and Einav, S., "Preliminary Experimental Evaluation of an Inverse Source Imaging Procedure Using a Decoupled Coil Detector Array in Magnetic Resonance Imaging," *Med. Eng. Phys.*, vol. 17, No. 4, 257–263 (1995).

Ra, J.B. and Rim, C.Y., "Fast Imaging Using Subencoding Data Sets from Multiple Detectors," *MRM*, vol. 30, 142–145 (1993).

*Primary Examiner*—Sandra L. O'Shea
*Assistant Examiner*—Michael Eisenberg
*Attorney, Agent, or Firm*—Lahive & Cockfield, LLP

[57] ABSTRACT

A magnetic resonance (MR) imaging apparatus and technique exploits spatial information inherent in a surface coil array to increase MR image acquisition speed, resolution and/or field of view. Partial signals are acquired simultaneously in the component coils of the array and formed into two or more signals corresponding to orthogonal spatial representations. In a Fourier embodiment, lines of the k-space matrix required for image production are formed using a set of separate, preferably linear combinations of the component coil signals to substitute for spatial modulations normally produced by phase encoding gradients. The signal combining may proceed in a parallel or flow-through fashion, or as post-processing, which in either case reduces the need for time-consuming gradient switching and expensive fast magnet arrangements. In the post-processing approach, stored signals are combined after the fact to yield the full data matrix. In the flow-through approach, a plug-in unit consisting of a coil array with an on board processor outputs two or more sets of combined spatial signals for each spin conditioning cycle, each directly corresponding to a distinct line in k-space. This partially parallel imaging strategy, dubbed SiMultaneous Acquisition of Spatial Harmonics (SMASH), is readily integrated with many existing fast imaging sequences, yielding multiplicative time savings without a significant sacrifice in spatial resolution or signal-to-noise ratio. An experimental system achieved two-fold improvement in image acquisition time with a prototype three-coil array, and larger factors are achievable with ther coil arrangements.

26 Claims, 11 Drawing Sheets constant cosKyY sinKyY cos2KyY sin2KyY

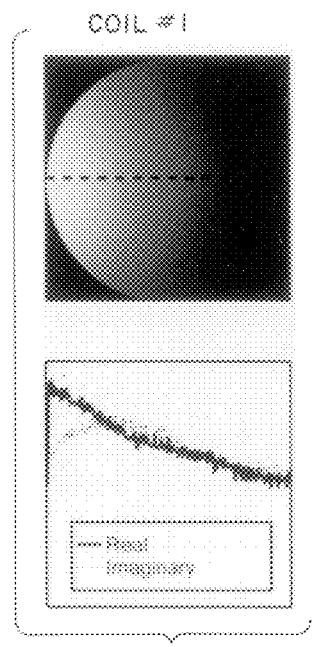 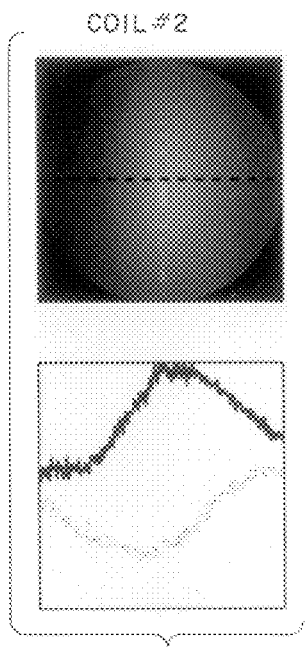 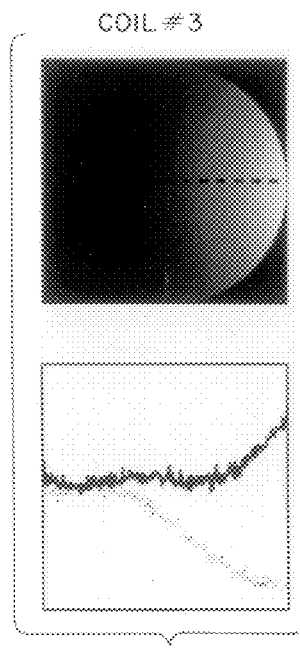
FIG. 4-1   FIG. 4-2   FIG. 4-3

SIMULTANEOUS ACQUISITION OF SPATIAL HARMONICS (SMASH): ULTRA-FAST IMAGING WITH RADIOFREQUENCY COIL ARRAYS

BACKGROUND

This invention is generally related to magnetic resonance imaging (MRI) using nuclear magnetic resonance (NMR) phenomena. It is particularly directed to a method and corresponding apparatus for more efficiently capturing and providing MRI data suitable for use in multi-dimensional imaging processes.

MRI is by now a widely accepted, medically important and commercially viable technique for obtaining digitized visual images representative of internal body tissue and structures. There are many commercially available approaches and there have been numerous publications describing these and other approaches to MRI. Many of these use multi-dimensional Fourier transformation techniques which are now well-known to those skilled in this art.

In general, MRI devices establish a constant homogeneous magnetic field to orient nuclear spins, apply a specific additional bias field gradient in a known plane or region under consideration, and apply a radiofrequency pulse or a sequence of pulses to perturb the nuclei. These nuclei in the known bias field gradient emit an RF signal in a specific band determined by the magnetic field distribution, and these RF emissions are detected by receiving coils and stored as a line of information in a data matrix known as the k-space matrix. The full matrix is built up by successive cycles of conditioning the spins, perturbing them, and collecting RF emissions. An image is then generated from this matrix by Fourier transformation, which converts the frequency information present in the RF oscillations to spatial information representing the distribution of nuclear spins in tissue or other imaged material.

Magnetic resonance imaging has proven to be a valuable clinical diagnostic tool in a wide range of organ systems and pathophysiologic processes. Both anatomic and functional information can be gleaned from the MR data, and new applications continue to develop with each improvement in basic imaging technique and technology. As technologic advances have improved achievable spatial resolution, for example, increasingly finer anatomic details have been able to be imaged and evaluated using MR. At the same time, fast imaging sequences have reduced imaging times to such an extent that many moving structures can now be visualized without significant motion artifacts.

Often, however, there is a tradeoff between spatial resolution and imaging time, since higher resolution images require a longer acquisition time. This balance between spatial and temporal resolution is particularly important in cardiac MR, where fine details of coronary artery anatomy, for example, must be discerned on the surface of a rapidly beating heart. A high-resolution image acquired over a large fraction of the cardiac cycle will be blurred and distorted by bulk cardiac motion, whereas a very fast image may not have the resolution necessary to trace the course and patency of coronary arteries. Some of the fastest imaging sequences currently implemented, such as echo planar imaging (EPI), approach the goal of yielding images of reasonable resolution in a suitably short fraction of the cardiac cycle. Other approaches have also been tried to eliminate the effects of cardiac motion, including k-space segmentation, in which image acquisition is divided up over several cardiac cycles with ECG gating to ensure that the heart is in the same phase of systole or diastole during acquisition of each segment. Cine images of multiple cardiac phases may be pieced together with this technique, with partial acquisitions for different phases occurring in each cardiac cycle. One problem with this class of techniques is that respiratory motion can change the position of the heart over the course of several cardiac cycles. Partial acquisitions will then be misregistered, and artifacts will result. In an attempt to eliminate or adjust for respiratory motion, breath holds, respiratory gating, and navigator echo gating techniques have all been tried, and each of these techniques has had some signficant successes. Nevertheless, an imaging strategy which allowed high-resolution images to be acquired comfortably within one or two phases of the cardiac cycle would circumvent many of the difficulties and residual artifacts associated with these compensation techniques.

The speed with which magnetic resonance (MR) images may be acquired has increased dramatically over the past decade. The improvements in speed may be traced to a combination of advances in the technologies of magnet construction and actuation, and innovations in imaging strategy. Strong, fast-switching magnetic field gradients and fast electronics have allowed the intervals between data collections to be reduced significantly. Meanwhile, fast gradient-echo and spin-echo sequences have reduced image acquisition time by allowing greater portions of k-space to be sampled after each spin excitation. Echo planar imaging (EPI), fast low-angle shot (FLASH), turbo spin echo (TSE), and spiral imaging techniques all allow very short intervals between acquisition of successive data points. The DUFIS, OUFIS, RUFIS, and BURST family of sequences further reduce image acquisition time by eliminating time delays incurred during gradient switching and echo formation. Details of the above-mentioned eight techniques may be found in the following papers: P. Mansfield, *Multi-planar image formation using NMR spin echoes. J. Phys. C.* 10, L55–58 (1977); A. Eaase, J. Frahm, D. Mattaei, W. Hanicke, K. D. Merboldt, *FLASH imaging: rapid NMR imaging using low flip-angle pulses. J. Magn. Reson.* 67, 256–266 (1986); J. L. Listerud, S. Einstein, E. Outwater, H. Y. Kressel, *First principles of fast spin echo. Magn. Reson. Q.* 8, 199–244 (1992); C. Meyer, B. B. Hu, D. Nishimura, A. Macovski, *Fast spiral coronary artery imaging. Magn. Reson. Med.* 28, 202–213 (1992); I. J. Lowe, R. E. Wysong, *DANTE ultrafast imaging sequence (DUlFIS). J. Magn. Reson. Ser. B* 101, 106–109 (1993); L. Zha, I. J. Lowe, *Optimized ultra-fast imaging sequence* (OUFIS). *Magn. Reson. Med.* 33, 377–395 (1995); D. P. Madio, I. J. Lowe, *Ultra-fast imaging using low flip angles and FIDs. Magn. Reson. Med.* 34, 525–529 (1995); and J. Hennig, M. Hodapp, *Burst imaging. MAGMA* 1, 39–48 (1993).

Increasing the speed of MR imaging further is a challenging proposition, since the aforementioned fast imaging techniques have already achieved an impressive efficiency. All these techniques allow very short intervals between acquisition of successive data points, and hence do not waste much time in accumulating the data for the k-space matrix required to generate an image. In flow-encoded EPI images, for example, the entire complex k-space matrix is filled in a single spin excitation (which is followed by multiple spin conditioning cycles involvinig the application of multiple stepped field gradients), and the resulting image matrix is likewise "full," with useful information stored in both the real and the imaginary channels. One common feature of nearly all the fast imaging techniques currently in use, however, is that they all acquire data in a sequential fashion. Whether the required data set, i.e., the k-space data matrix, is filled in a rectangular raster pattern, a spiral pattern, a rapid series of line scans, or some other novel order, it is acquired one point and one line at a time.

That is, the prior art in fast MR imaging has concentrated on increasing the speed of sequential acquisition by reducing the intervals between scanned lines. Modifications to pulse sequences or to magnetic field gradients have yielded a gradual improvement in imaging speed by allowing faster sequential scanning of k-space, but these improvements face limits due to the intervals necessary to create, switch or measure the magnetic fields or signals involved in data acquisition. It would therefore appear difficult to devise a sequential technique with significantly better efficiency than the current fast imaging techniques.

Several fast imaging schemes have been proposed to date using simultaneous data acquisition in multiple RF coils, as described in: D. Kwiat, S. Einav, G. Navon, *A decoupled coil detector array for fast image acquisition in magnetic resonance imaging. Med Phys,* 18:251–265 (1991); D. Kwiat, S. Einav, *Preliminary experimental evaluation of an inverse source imaging procedure using a decoupled coil detector array in magnetic resonance imaging. Med Eng Phys,* 27, 257–263 (1995); J. W. Carlson, T. Minemura, *Imaging time reduction through multiple receiver coil data acquisition and image reconstruction. Magn Reson Med* 29, 681–688 (1993) and U.S. Pat. No. 4,857,846 of J. W. Carlson; and J. B. Ra, C. Y. Rim, *Fast imaging using subencoding data sets from multiple detectors. Magn Reson Med* 30, 142–145 (1993). These approaches have offered the promise of significant savings in image acquisition times.

The Carlson and Minemura paper describes a twofold acquisition time savings using two nested body coils. In their approach, partial data sets are collected simultaneously in the two coils, one of homogeneous sensitivity and the other with a linear gradient in sensitivity. Missing lines in k-space are generated using a series expansion in terms of other phase-encoded lines. This approach using body coils appears to require that a significant portion of the data for the partial k-space matrix be acquired before any of the missing lines can be filled in by postprocessing, and thus does not allow for the missing lines to be built up as the data arrives, in real time. The approach uses coil sensitivity information in place of some portion of the gradient phase encoding steps, but has drawbacks. The coils used by Carlson and Minemura are body coils, which provide large volume coverage but lower overall sensitivity than surface coils, and it would be difficult to augment their number to improve time savings.

The approach of Ra and Rim involves a simultaneous acquisition technique in which images of reduced FOV are acquired in multiple coils of an array and the Nyquist aliasing in those images is undone by reference to component coil sensitivity information. The unaliasing procedure involves a pixel-by-pixel matrix inversion to regenerate the full FOV from multiple copies of the aliased image data. The "subencoding" technique of Ra and Rim relies on estimates of component coil sensitivities by effectively probing the sensitivity at each pixel. This pixel-by-pixel approach can lead to local artifacts; for example, the matrix inversion can begin to fail in regions of low sensitivity. Further, by its very nature as a pixel by pixel dealiasing approach, the Ra & Rim method is computation-intensive and is limited to postprocessing, as all image data must be present before the reconstruction can be undertaken.

In a related area, multiple coil signal collection has been used in MR phased array systems as reported in R. B. Roemer, W. A. Edelstein, C. E. Hayes, S. P. Souza, and O. M. Mueller, *The NMR phased array. Magn. Reson. Med.* 26, 192–225 (1990); C. E. Hayes and P. B. Roemer, *Noise correlations in data simultaneously acquired from multiple surface coil arrays. Magn. Reson. Med.* 16, 181–191 (1990); C. E. Hayes N. Hattes, and P. B. Roemer, *Volume imaging with MR phased arrays. Magn. Reson. Med.* 18, 309–319 (1991). The increased information content of the multiple received signals in such systems has been used to increase the signal-to-noise ratio (SNR) of MR images. Since their initial description, phased arrays have seen increasing use in clinical MR imaging. For example, the improvements in SNR provided by phased arrays have allowed significant advances in imaging of the pulmonary vasculature as reported by T. K. F. Foo, J. R. MacFall, C. E. Hayes, H. D. Sostman, and B. E. Slayman, *Pulmonary vasculature: single breath-hold MR imaging with phased array coils. Radiology* 183, 473–477 (1992). Still, with a few notable exceptions, the bulk of phased array applications have addressed increased sensitivity, with little effort towards improving image acquisition speed or spatial resolution.

SUMMARY OF THE INVENTON

An MRI system according to the present invention uses a multiple-coil data collection system to acquire some portion of the k-space matrix in parallel, rather than sequentially in time. In a preferred embodiment, signals are obtained from multiple RF coils each occupying a different position with respect to the imaged volume, and each therefore having different but at least partially overlapping spatial sensitivities. The multiple coils are preferably positioned and/or their outputs sampled in a manner to minimize inductive coupling, but they need not individually span the full region of interest nor be fully independent. The signals collected in this plurality of coils are then combined with suitably chosen weights to produce two or more composite signals, each of which approximates a sinusoidal sensitivity modulation, or "spatial harmonic." As used herein, the term "spatial harmonic" refers to a sinusoidal and/or cosinusoidal variation in spatial sensitivity with a wavelength that is an integer fraction of the extent of the field of view. Each line of these spatial harmonic composite signals constitutes an additional line of the k-space matrix which would require a distinct gradient step in a conventional MR acquisition. Thus, the use of such signal combinations eliminates the need for some of the conventional gradient steps. The technique just outlined is referred to herein as SiMultaneous Acquisition of Spatial Harmonics (SMASH), and it may be used to reduce image acquisition times by a multiplicative factor without a significant sacrifice in spatial resolution or signal-to-noise ratio (SNR). The invention also includes non-Fourier embodiments, in which the coil signals are tranformed or combined with weights to yield composite signals which each correspond to a non-Fourier spatial distribution, such as a wavelet.

The SMASH technique in its preferred embodiment is implemented in an MR imaging apparatus and uses linear combinations of the simultaneously acquired signals from multiple surface coils to generate multiple data sets with distinct offsets in k-space. The full k-space matrix is reconstituted by interleaving these shifted data sets, and an image is therefore generated with only a fraction of the usual number of gradient encoding steps. Consequently, the total image acquisition time may be reduced or the total quantity of data generated during a fixed acquisition time may be increased by this same fraction.

Conceptually, the invention may be seen as partially replacing gradient phase encoding by a spatial encoding procedure tied to the detection apparatus. In SMASH, some of the spatial modulations that normally distinguish differently phase-encoded lines are generated instead by amplitude modulation, resulting from combinations of component signals from multiple coils arrayed above or around the imaging volume. Computationally, by shifting responsibility for spatial encoding from the spin preparation stage to the stage of signal detection and combination, applicant is able to combine the multiple simultaneously acquired signals, either immediately on-the-fly or after-the-fact, to produce multiple different spatial harmonics. In this manner, multiple lines in k-space are acquired simultaneously, in a parallel rather than a purely sequential acquisition scheme.

A representative apparatus implementing the invention simultaneously acquires partial signals from multiple coils in a surface coil array and combines them into two or more differently weighted combinations that accurately represent several spatial harmonics. The weights may be generated by theoretical calculations based on coil geometry, or else they may be derived by a calibration protocol carried out on a phantom image or on a pre-scan at the time of in vivo imaging. The calibration protocol typically uses a numerical optimization algorithm to determine coefficients for linear signal combination which will best approximate the desired spatial harmonics. Once the spatial harmonic signal combinations have been formed, the missing lines in k-space are filled in, and the conventional MR image is generated by Fourier transformation of the expanded data matrix. Preferably, the coils in a SMASH coil array are surface coils, i.e. coils positioned on the surface of the body and designed to capture the MR signal efficiently over a restricted region of interest. Such surface coils typically have a spatial extent on the order of 5–50 centimeters.

BRIEF DESCRIPTION OF THE DRAWINGS

These and other features of the invention will be understood from the description herein read in light of the prior art, together with the drawings illustrating representative embodiments of the invention, wherein

FIGS. 4-1, 4-2, and 4-3 illustrate sensitivity reference images formed from the coil array of FIG. 2B and the complex sensitivities of the coils;

FIGS. 4A-1, 4A-2, 4A-3 and 4A-4 illustrates actual fitting of spatial harmonics with complex weighted coil sensitivity functions;

DETAILED DESCRIPTION

Figure 1:
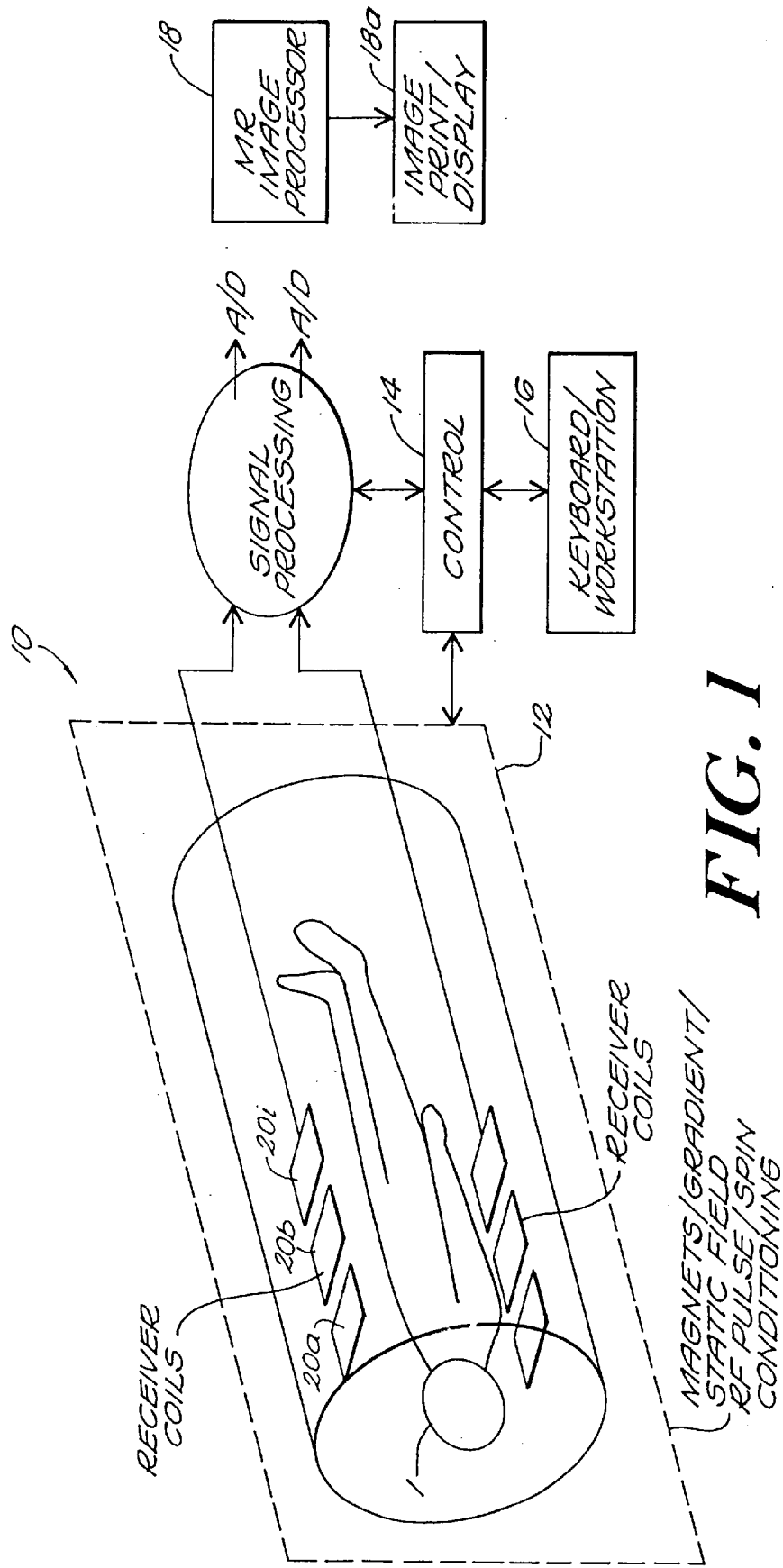
FIG. 1 illustrates a general MRI apparatus having features common to the invention and to the prior art.

FIG. 1 illustrates schematically an MRI system 10 which includes the usual static magnet assembly, gradient coils, and transmit RF coils collectively denoted 12 under control of a processor 14, which typically communicates with an operator via a conventional keyboard/control workstation 16. These devices generally employ a system of multiple processors for carrying out specialized timing and other functions in the MRI system 10 as will be appreciated. Accordingly, as depicted in FIG. 1, an MRI image processor 18 receives digitized data representing RF NMR responses from an object region under examination (e.g., a human body 1) and, typically via multiple Fourier transformation processes well-known in the art, calculates a digitized visual image (e.g., a two-dimensional array of picture elements or pixels, each of which may have different gradations of gray values or color values, or the like) which is then conventionally displayed, or printed out, on a display 18a.

In such overall operation, the apparatus of the present invention is largely conventional. However, in accordance with the present invention, the basic RF data acquisition is modified, and subsequent signal processing altered, by providing a plurality of surface coils 20a, 20b . . . 20i for simultaneous signal reception, along with corresponding signal processing and digitizing channels. The processor recombines the cllected values into two or more spatial harmonics from which multiple lines of the signal matrix are developed. This recombination may be performed in real time as the data arrives, or after the fact via postprocessing as is convenient with the apparatus and the calibration information at hand.

Operation of the invention will be better understood from a description of gradient phase encoding in conventional processing and a comparison to the spatial encoding produced by amplitude modulation of the multiple coil signals in the present invention, and a consideration of the information available in spatial harmonics.

In the general case, the magnetic resonance signal for a plane with spin density p(x,y) and coil sensitivity C(x,y) may be written as follows:

$$S(k_x,K_y)=\int dxdy C(x,y)p(x,y)exp\{-ik_xx-ik_yy\}=\hat{C}(k_x,K_y) \otimes \hat{p} (k_x,k_y),\quad [1]$$

where $k_x=\gamma G_x t_x$ and $k_y=\gamma G_y t_y$ as usual, with g the gyromagnetic ratio, $G_x$ and $G_y$ the magnitude of the x and y gradients, and $t_x$ and $t_y$ the times spent the in the x and y gradients, respectively. Here, the spin excitation function as well as the effects of relaxation have been incorporated into a pulse-sequence-specific sensitivity function C. The symbol $\otimes$ indicates a convolution. For regions of the sample in which the coil sensitivity is roughly homogeneous we may write C(x,y)=1, and $S(k_x, k_y)$ is equal to $\hat{p}(k_x, k_y)$, the spatial Fourier transform of the spin density function. Double Fourier transformation with respect to $k_x$ and $k_y$ reconstructs the usual spin-density image p(x,y).

Figure 2:
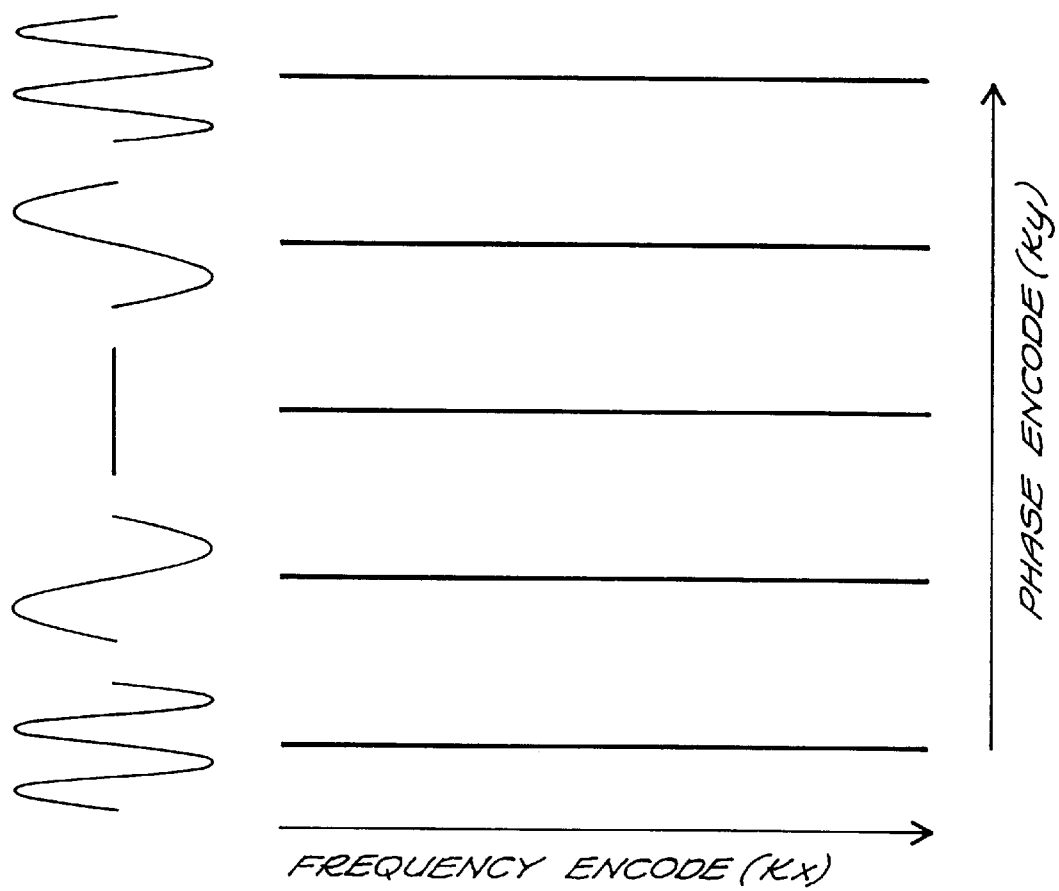
FIG. 2 illustrates a conventional data acquisition scheme.

In a prior art phase-warp imaging method, a k-space matrix of frequency-encoded and phase-encoded information, as represented generally in FIG. 2, is produced for the image plane of interest, with each successive line in k-space represented by a broad horizontal line corresponding to a different phase-encoding gradient value. Each phase encoding step corresponds to a distinct spatial modulation, and these spatial modulations are represented schematically by the curves at the left of FIG. 2.

Generally prior art magnetic resonance receiver coils, especially surface coils, do not have uniform sensitivity.

Signals from different regions of the imaged volume produce different currents in an RF coil, with the spatial variation in sensitivity being simply related to the inhomogeneity of RF field produced by the coil over the sample volume. For a standard circular surface coil, there is a sensitivity "sweet spot" centered at roughly one diameter below the coil, with a monotonic falloff of sensitivity together with increasing phase differences in all directions. Traditional imaging protocols often position the receiving coil with the target tissue at its region of maximum sensitivity.

Applicant realized, however, that when collecting a signal with some combination of coils having an aggregate sinusoidal and cosinusoidal spatial sensitivity profile, the MR signal from these coils will have an information content somewhat different from that of the usual coil signal, and that by separating out one or more collected signals corresponding to pure spatial harmonics, these may be used to fill a larger portion of the data space than is conventionally done. A complex combination of cosinusoidal and sinusoidal sensitivity profiles yields $$C(x,y) = exp\{iK_y \gamma\} = \cos K_y \gamma + i \sin K_y \gamma, \quad [2]$$

where $K_y$ is the spatial frequency of the inhomogeneous coil sensitivity. For the MR signal, we then have $$S(k_x, k_y) = \int \int dx dy \rho(x,y) exp\{-ik_x x - i(k_y - K_y)\gamma\} = \hat{\rho}(k_x, k_y - K_y) \quad [3]$$

Figure 2A:
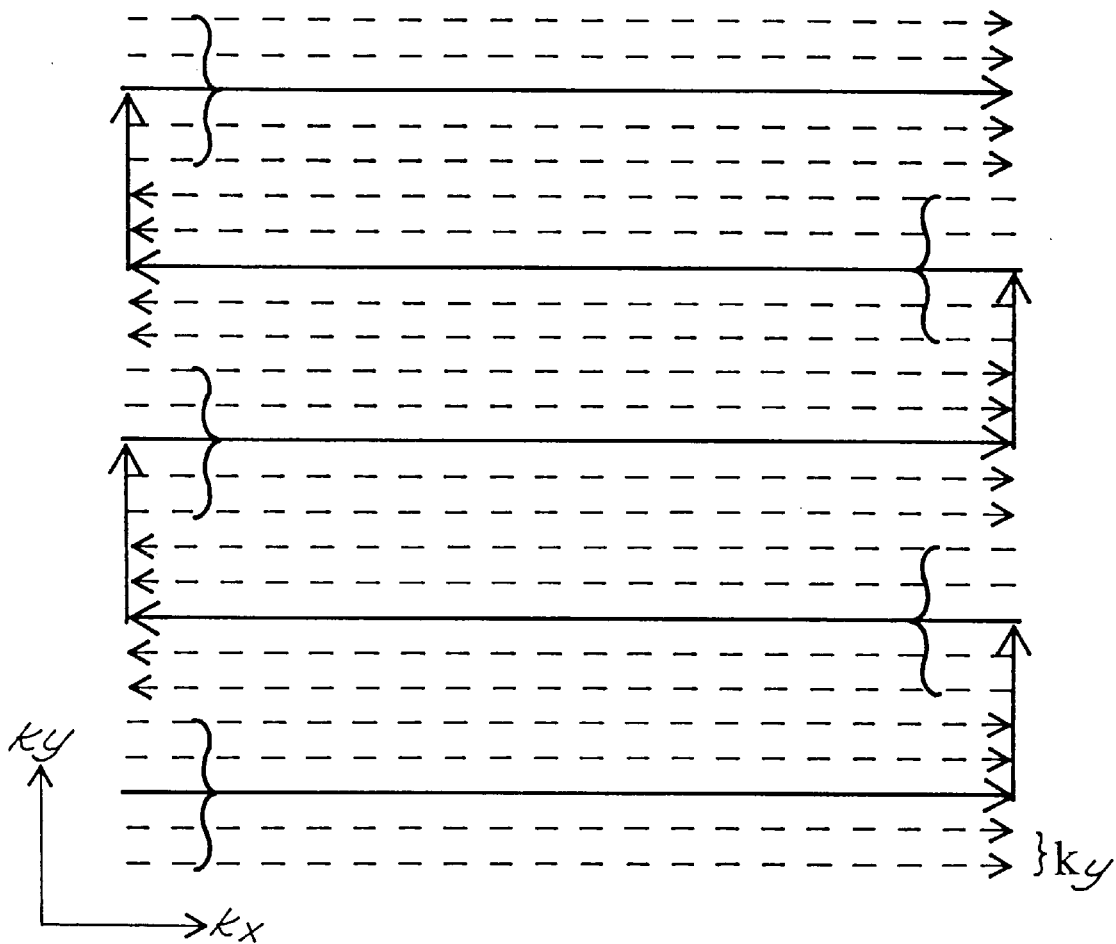
FIG. 2A illustrates data acquisition of the present invention.

In other words, the combined MR signal from the inhomogeneous coils is shifted in k-space by an amount $-K_y$. This k-space shift has precisely the same form as the phase-encoding shift produced by evolution in a y gradient of magnitude $\gamma G_y t_{y=-K_y}$. Thus, when this shifted signal is acquired simultaneously with the usual signal from a homogeneous coil, one gains an extra line in k-space for each application of the x and y gradients. Applicant exploits this realization to convert the signals collected in a set of surface coils into spatial harmonic signals, and fill multiple lines of k-space from each signal collection. If one such harmonic is generated in addition to the homogeneous signal (zero$^{th}$ harmonic) then one may then apply half as many y gradient steps to build up the full k-space matrix necessary for image acquisition. When higher harmonics of larger $K_y$ are added, the number of necessary y gradient steps is further reduced. For a multiple coil setup representing M spatial harmonics in addition to the homogeneous signal, the acquisition time is reduced by an integer factor of M+1. If both positive and negative exponentials are used, $$C_{\pm}(x,y) = exp\{\pm iK_y \gamma\} = \cos K_y \gamma \pm i \sin K_y \gamma, \quad [4]$$

an extra line appears at an interval $K_y$ above and below each gradient-encoded line. The k-space geometry of this acquisition strategy is illustrated in FIG. 2A. In the figure, frequency encoding gradient steps are indicated by thick horizontal lines, phase encoding gradient steps by thick vertical lines. Extra k-space lines derived from harmonics of the nfundamental spatial frequency Ky are shown as dashed lines. Here, two extra harmonics have been used, each one yielding a line above and a line below the thick homogeneous line, for a total of five lines per readout (indicated by heavy brackets). This illustrative simultaneous acquisition procedure represents a fivefold savings in total acquisition time as compared with a conventional acquisition with the same resolution and field of view.

Thus, if one were to collect a signal with a coil shaped so that the response it picked up had the form of such a spatial harmonic, it would directly yield a shifted k-space entry, and an array of such coils might simultaneously acquire several lines of data corresponding to several distinct gradient steps.

Applicant further realized that the sensitivity of each individual coil in an array need not be strictly sinusoidal, so long as the net sensitivity of the array may be configured to assume the desired sinusoidal shape. This realization significantly relaxes the constraints on coil design and disposition, and in conjunction with a calibration process, allows the signals from multiple coils with a wide range of shapes and geometries to be combined in several ways to yield multiple net signals with each with its own distinct sinusoidal sensitivity profile.

Figure 2B:
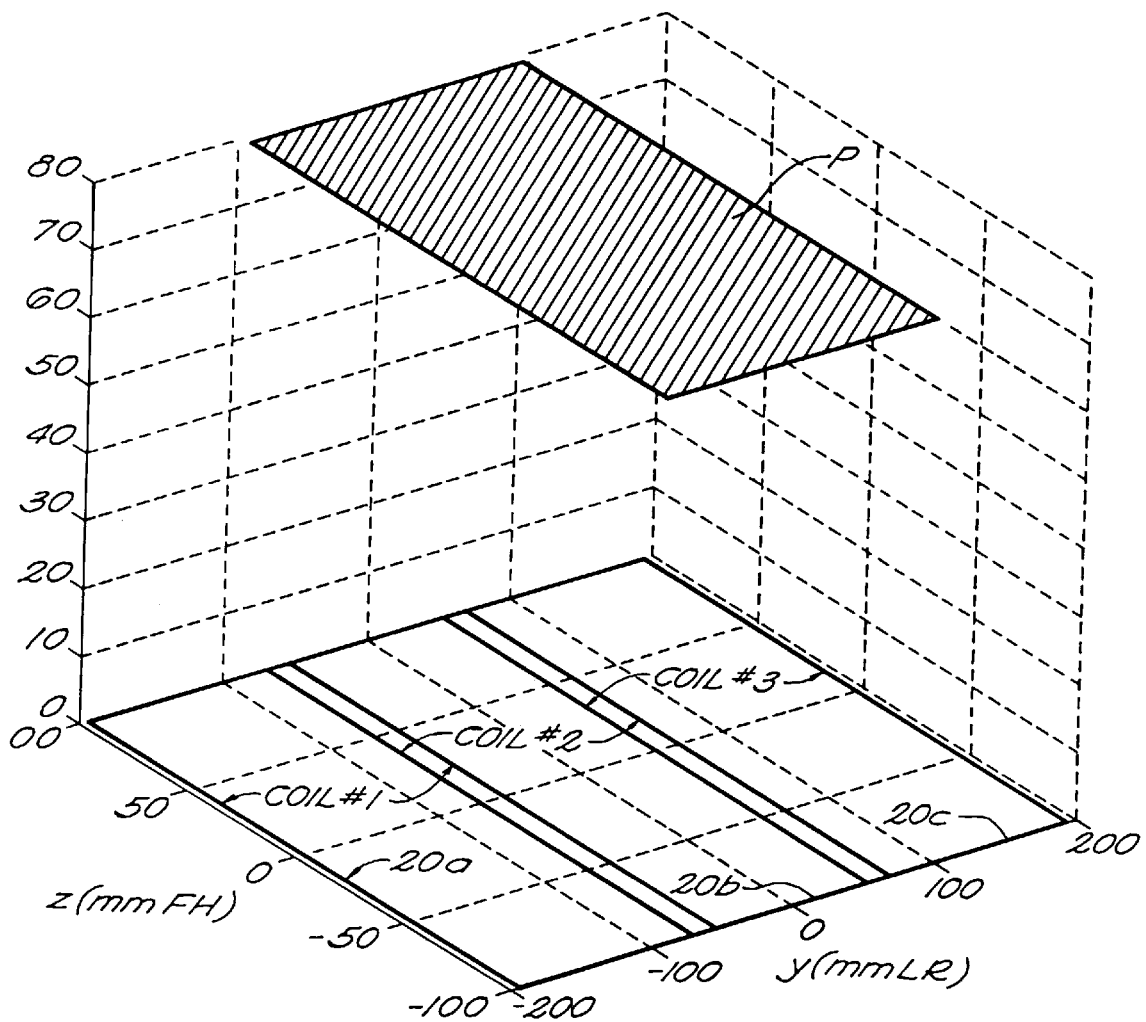
FIG. 2B illustrates a receiver coil array of the invention and a representative image plane geometry.

FIG. 2B illustrates the geometry of an exemplary coil array and a representative image plane above it. A set of three adjacent coils are used with separate coil outputs in a surface array extending generally across the region and planes of interest. The patient is positioned and the spin preparation fields are applied to condition a plane P which, by way of example may intersect the patient's heart to image the blood vessels thereof, or which may intersect a region of the abdomen to image its contents. The coil array 20 is located above or below the region to be imaged, so that each coil 20a, 20b, 20c has at least some sensitivity to RF signals emanating from region P. In the illustrated embodiment the coils are each somewhat overlapped in the y-direction to minimize inductive coupling. As shown, they are overlapped at neighboring edges. Each coil, viewed individually has a sensitivity function which is highest directly above or below the center of the coil, and which falls off with distance from the coil center. In accordance with the present invention, the signals from these coils are combined to produce several separate "virtual" or synthetic signals which each correspond to a pure spatial harmonic.

Figure 3:
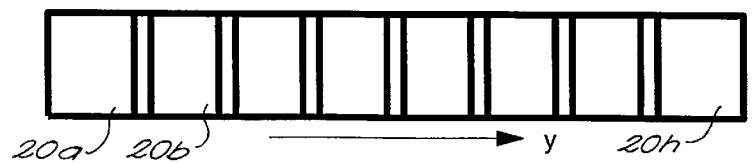
FIGS. 3, 3A, 3B, 3C, 3D and 3E illustrate another receiver coil array of the invention together with individual sensitivities and the construction of spatial harmonics from component coil sensitivities.
Figure 3A:
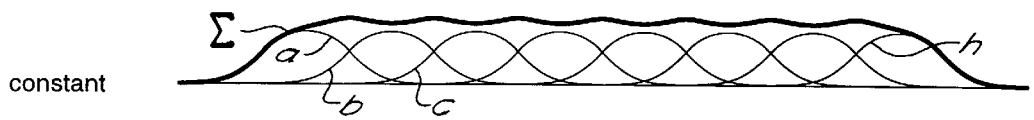
Figure 3B:
Figure 3C:
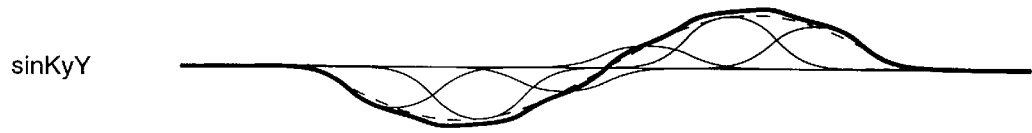
Figure 3D:
Figure 3E:

FIG. 3A demonstrates this situation schematically for a set of eight rectangular coils 20a, 20b, . . . 20h laid end-to-end, with a slight overlap. As shown in line (A) of the Figure, each coil 20a, 20b . . . has a sensitivity curve a, b, . . . which rises to a broad peak directly under the coil and drops off substantially beyond the coil perimeter. The sum of the coil sensitivities forms a relatively constant sensitivity, over the full length of the array, corresponding to the zero$^{th}$ spatial harmonic. The remaining lines (B)–(E) of FIGS. 3B–3E illustrate recombinations of different ones of these individual offset but otherwise identical coil sensitivity functions into a new synthetic sinusoidal spatial sensitivity. Different weightings of the individual component coil sensitivities lead to net sensitivity profiles approximating several of the spatial harmonics of $K_y$. In the FIGURE, coil sensitivities (modeled schematically for this Figure as Gaussian in shape) are combined to produce harmonics at various fractions of the fundamental spatial wavelength $=\lambda_y 2\pi/K_y$, with $\lambda_y$ being on the order of the total coil array extent in y. Weighted individual coil sensitivity profiles are depicted as thin solid lines beneath each component coil. Dashed lines represent the sinusoidal or cosinusoidal weighting functions. Combined sensitivity profiles are indicated by thick solid lines. These combined profiles closely approximate ideal spatial harmonics across the array.

For a weighted sum of component coil signals, the net sensitivity profile $C^{tot}(x,y)$ is a linear combination of the intrinsic sensitivity profiles of the component coils. In this case, for an N-component coil array, we have $$C^{tot}(x, y) = \sum_{j=1}^{N} n_j C_j(x, y) \quad [5]$$

where $n_j$ is the weighting coefficient of the $j^{th}$ coil sensitivity function $C_j(x,y)$.

In accordance with the aspect of the invention illustrated in FIG. 3, by simply weighting the signals in the coil array with appropriate weights and combining them, one obtains a signal whose amplitude is modulated by the spatial harmonic corresponding to that combination of the coil sensitivities. That is, the N (in this case, eight) component coil signals are acquired simultaneously and then multiplied by various weights and recombined in a total of up to N independent combinations each representing a spatial harmonic corresponding to a distinct gradient phase encoding step or distinct offset in k-space. This additional processing does not add in any way to image acquisition time, and it may be performed quickly on stored signal data as part of a post-processing algorithm or else may be implemented in a simultaneous flow-through fashion as described below.

In actual practice, the sensitivity profiles of RF surface coils are not simple Gaussian profiles but more complicated functions which are, in general, complex in the mathematical sense of having both real and imaginary components. The coil sensitivity functions must describe both the magnitudes and the phases of the signals produced by precessing spins at various distances from the coil center, and these magnitudes and phases vary according to the reciprocity relation $$E(r) = -\frac{d}{dt}\{B_{1xy}(r) \cdot m(r)\} \quad [6]$$

where E(r) is the voltage induced in a coil by a given voxel at position ir, m(r) is the nuclear magnetic moment of the voxel, and $B_{1xy}(r)$ is the xy vector component of the field generated at r by a unit current in the coil as described for example in D. I. Hoult and R. E. Richards, *The signal-to-noise ratio of the nuclear magnetic resonance experiment. J. Magn. Reson.* 24, 71–85 (1976).

The fact that the sensitivity functions are complex rather than purely real has two main consequences for applicant's SMASH reconstruction: first, applicant assigns complex weights $n_j$ to capture the full information content of the coil sensitivity functions, and second, the target complex exponential sensitivities $$C_{3S}(x,y) = exp\{\pm i K_y \gamma\} = \cos K_y 6S \pm i \sin K_y \gamma$$

are preferably developed directly, rather than by separate generation and subsequent combination of sines and cosines. The real and imaginary parts of the complex coil sensitivity combinations may be fitted simultaneously to the real and imaginary parts of $C_{3S}(x,y)$. This may be done, for example, with a numerical optimization algorithm using the sum of absolute magnitude deviations from the target profile or some other similar quantity as a measure of goodness of fit. In the prototype described below, this fitting was performed in a straightforward manner and integrated with data reconstruction algorithms written by applicant in the MATLAB programming language (Mathworks, Natick Massachusetts). Applicant has now confirmed that such processing produces good image quality at greatly enhanced speed.

In setting up an actual MR imaging apparatus, the coil geometry for SMASH signal acquisition may be that of an MR phased array, as described in P. B. Roemer, W. A. Edelstein, C. E. Hayes, S. P. Souza, and O. M. Mueller, *The NMR phased array, Magn. Reson. Med.* 16, 192–225 (1990); C. E. Hayes and P. B. Roemer, *Noise correlations in data simultaneously acquired from multiple surface coil arrays. Magn. Reson. Med.* 26, 181–191 (1990); and C. E. Hayes, N. Hattes, and P. B. Roemer, *Volume imaging with MR phased arrays. Magn. Reson. Med.* 18, 309–319 (1991). Indeed, many of the hardware components useful for SMASH imaging are already present in traditional phased arrays, which contain multiple inductively decoupled coils with some spatial separation, and which include separate receivers for independent collection of data from the coils. The technical problem of minimizing inductive coupling of such coils has been previously addressed for multiple-coil constructions in the context of phased-array MR imaging devices, and two basic strategies were developed. One strategy is to design a coil array with an appropriately chosen overlap of neighboring component coils to minimize inductive coupling. The second strategy involves the use of low input impedance preamplifiers on each component coil channel. Both of these features are advantageously applied in various embodiments of the present invention.

A Prototype and Results

Applicant has implemented a basic embodiment of the invention as outlined above in the following manner. First, a linear RF coil array as shown in FIG. 2B was selected having a geometry suitable for spatial harmonic generation. This array was a cardiac imaging array having three 200 mm×150 mm rectangular coils adjacent to each other and partially overlapping. The appropriateness of the coil geometry was first tested in numerical simulations, using analytic integration of the Biot-Savart law to calculate the transverse field $B_{1xy}(r)$ of Eq. [6], and hence to model the sensitivity profile of each coil. Taking into account the number of spatial harmonics that could comfortably be generated using the coil array, and therefore the fraction of the total k-space matrix to be collected, partial image acquisitions were planned, and a regimen of gradient steps and RF pulses were established. Image data were then acquired from each coil simultaneously in the separate channels of the array, using a conventional fast imaging sequence. Since only a fraction of the usual signal data was to be used to generate the final images, only a faction of the usual imaging time was spent on data collection.

In accordance with this aspect of the invention, the stored coil signals received during each spin conditioning cycle of image acquisition were recombined with weights as determined below into two distinct spatial harmonics, corresponding to two distinct kspace-shifted signals. The data sets were then interleaved, in the ordering sequence of FIG. 2A, to yield the full k-space matrix. This matrix was double Fourier transformed in the conventional manner to give the reconstructed SMASH image. In the prototype, this data was reconstructed after the fact, i.e., post processed to both determine a suitable set of weights for forming the composite spatial harmonic sensitivities, and then to recombine the already measured signals with those weights into corresponding spatial harmonic measurement signals. In various embodiments of the device, however, the optimal weightings may be determined in advance with prior knowledge of the coil sensitivities, and the conversion of coil signals may be performed on-the-fly, that is, in real time. For example, a simple controller attached to the coils may determine the appropriate weights, from a lookup table or by some other linear or non-linear interpolative mechanism, and then combine the signals to produce a separate composite signal corresponding to each spatial harmonic. A neural network may be used to "learn" the appropriate weighting.

Figures 1, 4A:
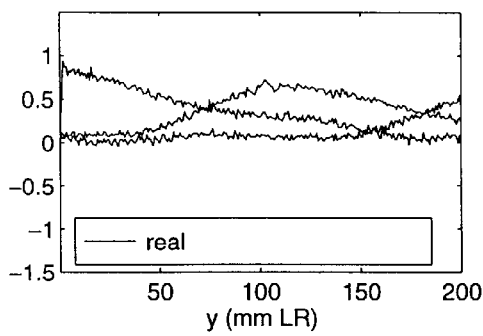
Figures 2, 4A:
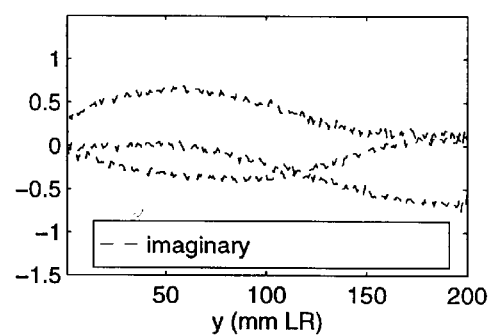
Figures 3, 4A:
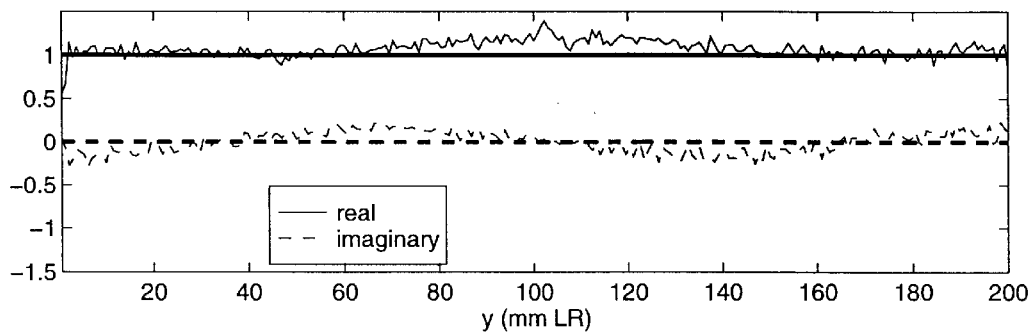
Figures 4, 4A:
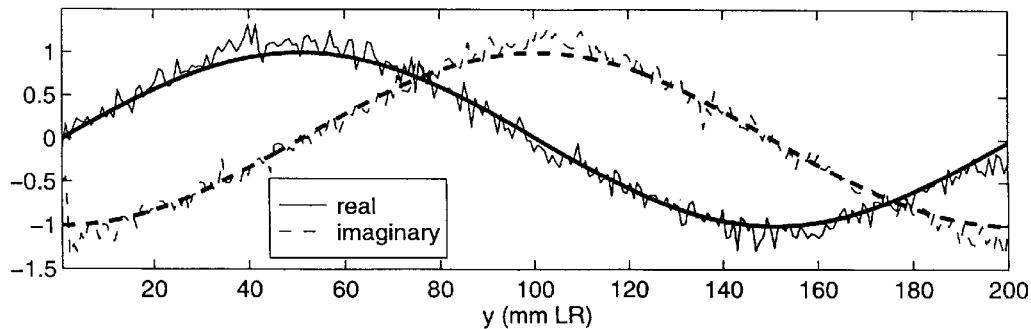

Determination of the weightings needed for spatial harmonic generation requires knowledge of component coil sensitivities. For the prototype, individual complex sensitivity profiles were determined for each of the component coils in the array using phantom image data instead of numerical simulations. This process is illustrated in FIGS. 4-1 to 4-3 and described in more detail below under the heading of "Determination of coil sensitivity and optimal component coil weights."

With this sensitivity data in hand, an iterative fitting procedure was employed to determine suitable weights for representing each spatial harmonic as a linear combination of the three sensitivities. The results of this procedure are shown in FIG. 4A-1–4A-4 and described further below.

For simple coil configurations, the sensitivity may be modeled analytically with accuracy, rather than be empirically derived from normalizing the coil responses to a uniform sample. More generally, the process illustrated in FIGS. 4-1 to 4-3 and 4A-1 to 4A-4 described below may be used to determine suitable coefficients for a given image plane, and this process may be repeated to compile a table for each of many planes so that the apparatus need only look up the necessary weights in order to produce the desired composite signals for the plane of interest. When the sensitivity information is known in advance, then, reconstruction does not require a preliminary sensitivity measurement or an iterative fitting procedure, and simply involves a set of weighted sums. In either case, once the new composite signals are formed, the additional data must simply be entered at the correct matrix position, and the full matrix subjected to a fast Fourier transform. This processing is as straightforward as the postprocessing which is commonly performed when conventional images are generated from phased arrays. Furthermore, once the full k-space matrix is constructed using the SMASH technique, subsequent processing of the k-space matrix to yield the image is identical to that presently employed in substantially all Fourier MR imaging systems.

Figure 5:
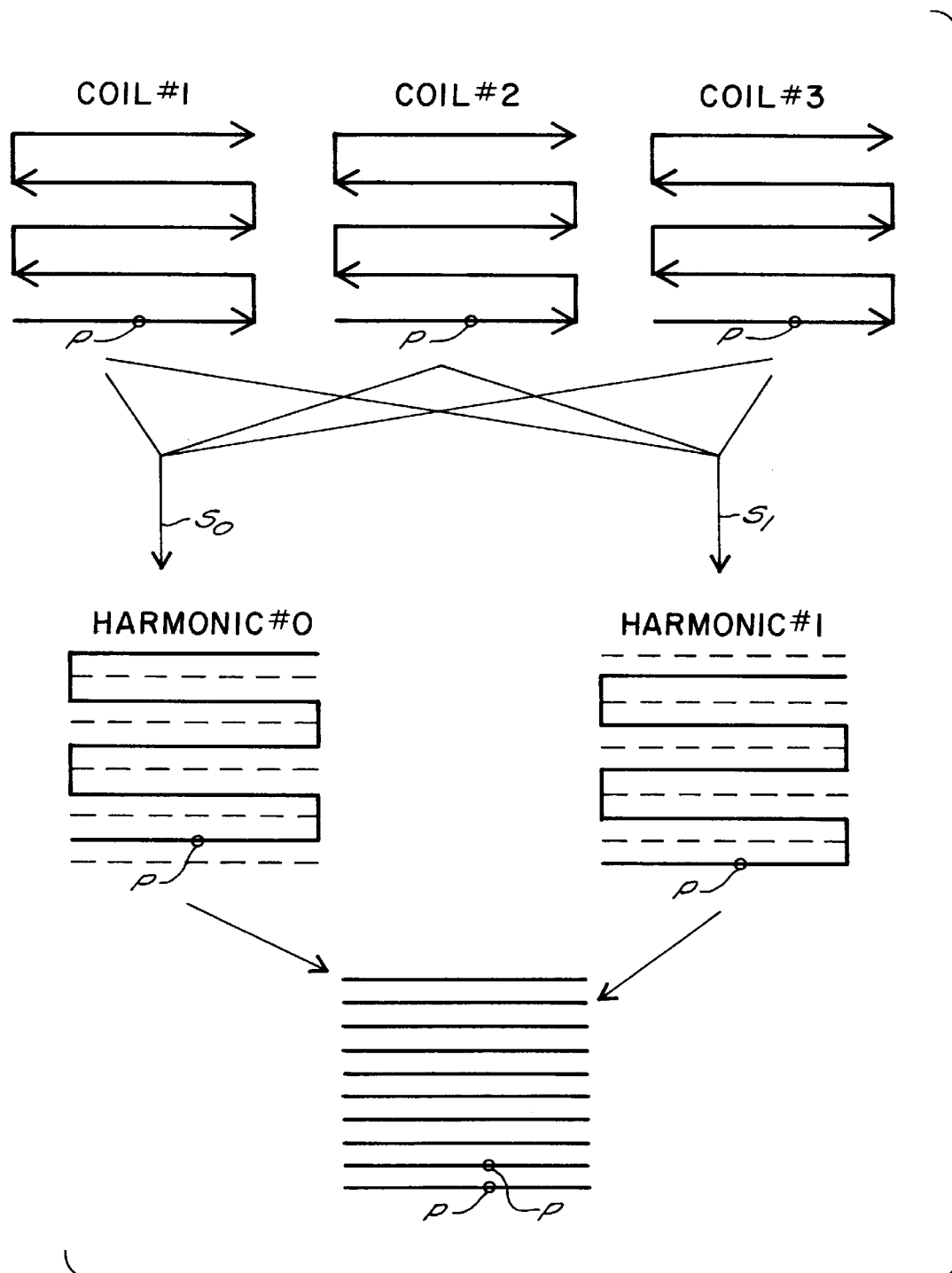
FIGS. 5 and 5A show signal processing steps and representative signals and images obtained from the coils of FIG. 2B and the fitting procedure of FIG. 4A-4 in a prototype embodiment of the invention.
Figure 5A:
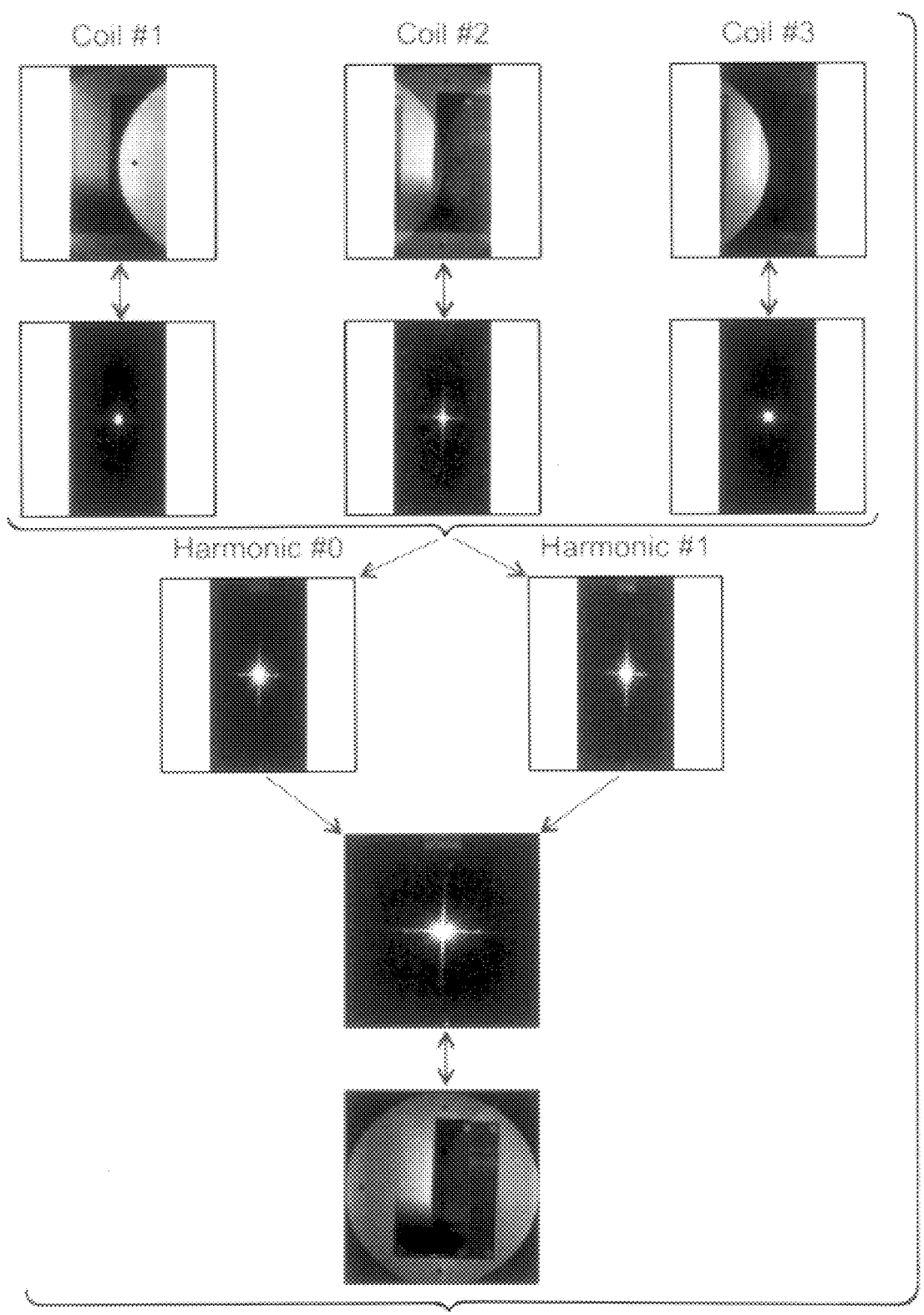

FIGS. 5 and 5A illustrate the k-space matrix construction for this prototype in more detail. Half the usual number of gradient steps with twice the usual spacing in k-space were applied, and the RF response was recorded in each of three coils. Given the gradient phase encoding regimen just described, each of these RF responses corresponded to an image of half the desired field of view. The coil signals were then combined into two sets with different weightings to produce synthetic composite signals corresponding to the zero$^{th}$ and first harmonics, and the two synthesized responses were interleaved to fill alternating lines of the k-space matrix. The matrix was then Fourier transformed in a conventional way to form the image. The resulting image had full resolution over the full field of view. As shown in FIG. 5, line (A) depicts the acquisition of signal in each component coil. A representative signal point P is picked up in each coil, and thus contributes to the line in k-space formed with each coil signal. Line (B) shows the processing performed in the prototype described above, according to which the coil signals are combined into a first set $S_0$ and a second set $S_1$ which each form different lines (even and odd as shown, corresponding to one gradient step separation) of the k-space matrix. These are combined at line (C) into the full matrix.

FIG. 5A illustrates corresponding images and signals, Line (A) of that FIGURE shows the half field-of-view images a, b, c reconstructed from separate coil sgnals, of which the signals themselves are shown in line (B). Line (C) shows the two spatial harmonic signals and line (D) the full interleaved signal, or k-space matrix. Line (E) illustrates the image reconstructed from the signals of line (C). The middle three stages (B), (C) and (D) correspond directly to the steps shown schematically in FIG. 5.

Figure 6A:
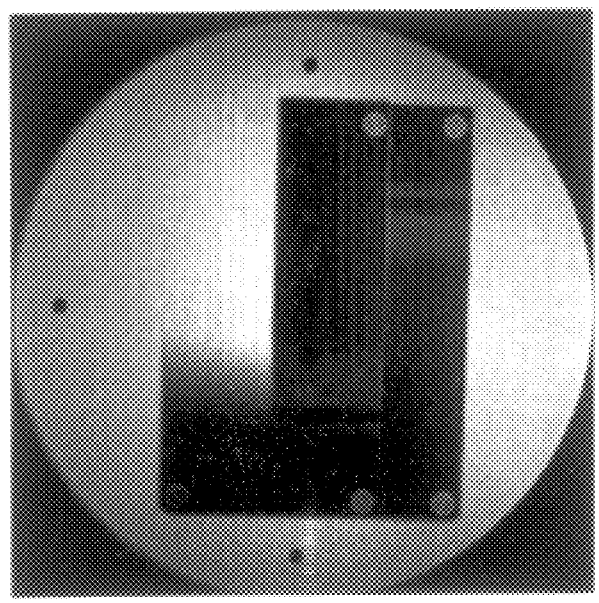
FIGS. 6A and 6B show MR images of a phantom made by processes of the prior art and the invention, respectively.
Figure 6B:
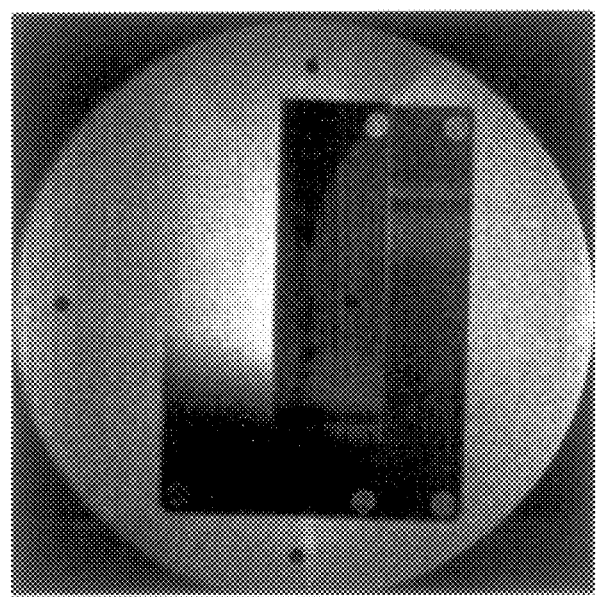

FIGS. 6A, 6B and 7A, 7B, respectively, compare test phantom and in vivo images formed by the three-coil prototype embodiment using the SMASH imaging technique with corresponding images formed using conventional techniques. FIG. 6A shows the proton-density image of a water-filled phantom, obtained using a TSE sequence (described further below) with a total conventional acquisition time of 10 seconds. FIG. 6B shows the equivalent image obtained in 5 seconds with the SMASH processing of the present invention. Apart from certain residual artifacts, the images have an identical appearance.

Figure 7A:
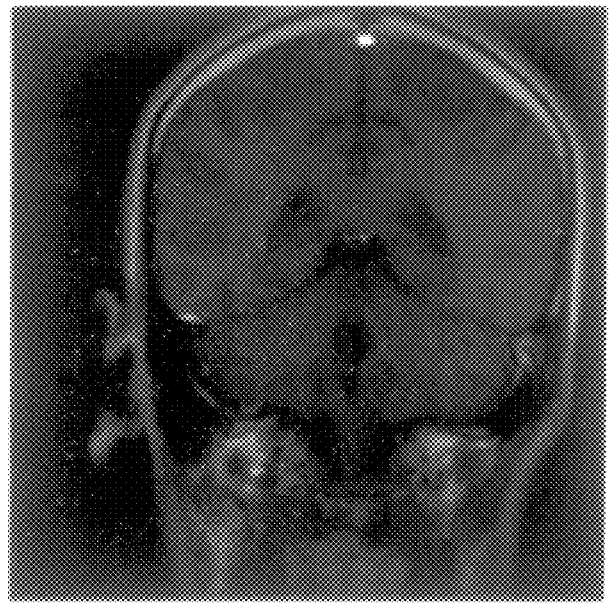
FIGS. 7A and 7B show MR images of a person's head made by processes of the prior art and the invention, respectively.
Figure 7B:
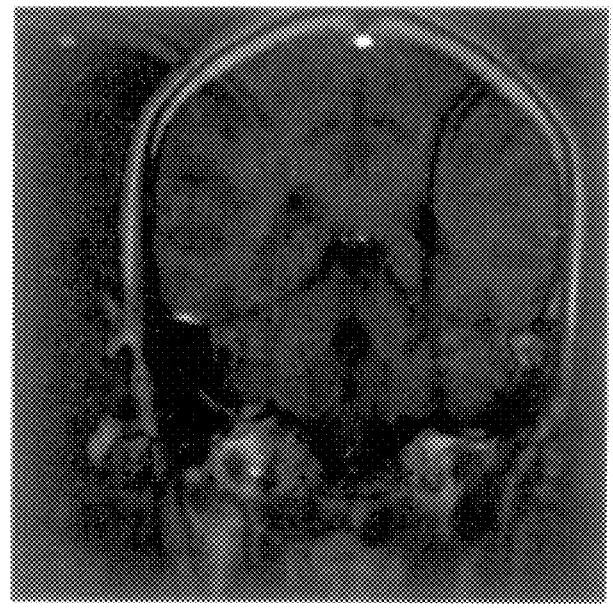

Similar results were obtained in vivo. FIGS. 7A and 7B show a reference and SMASH-reconstructed coronal image through the brain of a healthy adult volunteer, the images being acquired in 71 and 35 seconds, respectively. All these images were acquired using commercial hardware and a convenient pulse sequence with high spatial resolution and good SNR; a fifty percent acquisition time reduction was achieved. The acquisition time savings described here have also been shown to apply to other commercial machines and pulse sequences, including some of the fastest MR imaging machines and sequences. Some residual foldover artifacts are present in the SMASH reconstructed image, due to imperfections in the composite spatial harmonic sensitivity profiles. However, the prototype used an existing coil array designed for other purposes, and improvements both in coil design and in the accuracy of coil sensitivity mapping and spatial harmonic generation, are expected to minimize these artifacts.

Further details of the prototype imaging process and equipment are given below.

Materials

The raw data for the foregoing images were generated on a commercial 1.5 Tesla whole body clinical MR imager, which was a Philips NT, made by Philips Medical Systems of Best, Netherlands. For the phantom images, a standard circular phantom of 200 mm diameter and varied internal structure was used. At certain levels, the extire extent of the phantom was uniformly filled with water, whereas at other levels it was separated into smaller compartments of varied geometry. The different regions of this phantom were used either as sensitivity references (uniform structure) or for test images (varied structure). A prototype coil array on hand in applicant's laboratory was used as the SMASH coil array. The equivalent circuit for this coil consisted of three rectangular component coils arranged in a linear array with a slight overlap in the right-left direction, similar to the array shown schematically in FIG. 2B. As these coils were designed for another purpose, details of the coil circuitry not relevant here resulted in more complicated sensitivity profiles than would be expected from the simple geometry described above. It was these sensitivity variations which were primarily responsible for the residual foldover artifacts noted in FIGS. 6B and 7B. A simpler coil designed with spatial harmonic generation in mind will circumvent these artifacts.

Image Planning and Data Collection

The phantom test images of FIG. 6A, B were generated as follows. First with the phantom centered over the coil array, data for the reference image were acquired in a 6 mm thick coronal slice parallel to and 80 mm above the plane of the array, using a turbo spin echo pulse sequence with five echoes per excitation. The field-of-view (FOV) was 200 mm, centered on the phantom, and matrix size was 256×256. Phase encoding was performed in the right-left direction (i.e. in the direction of the coil array), with a single signal average. Data from each of the three component coil channels was acquired simultaneously and, in the prototype, were stored separately for later processing. Acquisition time was measured at 10 seconds. Next, a second coronal slice using the same technique and imaging parameters was taken to serve as a measure of component coil sensitivity. It was acquired 12 mm above the first one, in a region of uniform spin density in the phantom. Then, a third image at the same level as the first was obtained in half the time using twice the phase-encode step, and hence half the field of view, in the right-left direction. Matrix size was now 256×128. Acquisition time was 5 seconds, exactly half the time taken for the first image.

For the in vivo images of FIGURIE 7A, B, the volunteer was positioned with his head above the coil array, and images were taken in the same plane and with the same parameters as for the phantom images, except that eight signal averages with a slice thickness of 10 mm were used to improve SNR. The coil sensitivity image from the phantom was also used as a sensitivity reference for the in vivo images.

Determination of Coil Sensitivity and Optimal Component Coil Weights

As mentioned above in connection with FIG. 4, coil weightings were determined by fitting actual coil sensitivity data to the desired spatial harmonic sensitivities. To do this, the sensitivity function along the right-left diameter of the phantom was extracted from the component coil sensitivity reference images. The phantom spans the entire extent of each image, and since the sensitivity reference image plane intersects the phantom in a region of uniform spin density, these intensity profiles correspond precisely to the complex sensitivity functions of the coils along the diameter. The sensitivity of each component surface coil falls off monotonically with distance from the coil, and the phase shift grows with distance from the coil center.

Optimal weights for linear combination of component coil signals were determined by iterative fitting of this sensitivity data to the target spatial harmonic sensitivity profiles, using a gradient descent fitting routine with the complex weights serving as fitting parameters and the sum of absolute magnitude deviations from the target profile serving as a measure of goodness of fit. Two target spatial harmonics were fit in this fashion: the zero-frequency harmonic corresponding to uniform sensitivity, and the first harmonic having a modulation wavelength equal to the field-of-view of 200 mm. The results, shown in panels C and D of FIG. 4A, demonstrates that very close fits to the target harmonics may be achieved by component coil weighting, even with only three coils. A slight residual ripple was present in the zeroth harmonic fit and this is primarily responsible for imperfections in the SMASH image reconstructions.

Image Reconstruction

FIG. 5A shows intermediate stages in SMASH reconstruction of the phantom image. The procedure for the in vivo image was identical. Using weights from the iterative fit, the three component coil signals (IB) representing half-time, half-FOV aliased images (A) were combined into two composite signal sets, one for the zero$^{th}$ spatial harmonic and one for the first spatial harmonic (C). Finally, the two composite signal data sets were interleaved to form a data matrix of size 256×256 (D), This matrix was Fourier transformed to yield the reconstructed image (E), which is also shown in FIG. 6B.

The reference images in FIGS. 6A AND 7A were formed by combining the component coil reference images pixel-by-pixel as the square root of the sum of square magnitudes.

Discussion

In general, the foregoing SMASH imaging technique may be applied with a great many of the known pulse sequences or spin conditioning techniques, and will in general share the advantages of the underlying sequential imaging methods which are used to collect partial k-space information. As long as suitable spatial harmonics may be generated with a coil array, the additional acquisition time savings afforded by SMASH reconstruction involves no significant sacrifice in resolution or SNR. This contrasts markedly with the trade-off in SNR or resolution that characterizes many existing approaches to fast imaging, such as low flip-angle sequences.

Signal-to-noise Ratio

Visual inspection of the phantom images in FIGS. 6A, 6B reveals a slight degradation in SNR in the SMASH reconstructed image as compared with the reference image. Part of this apparent loss may be traced to the residual foldover artifacts, in which some of the intensity of the primary image is "stolen" by aliased ghosts. There is another noteworthy difference between the SNR profiles of the two images, however. The conventional reference image in FIG. 6A was generated using a sum-of-squares combination of component coil images, as is described in PB. Roemer, W. A. Edelstein, C. E. Hayes, S. P. Souza, and O. M. Mueller, *The NMR phased array. Magn. Reson. Med.* 16, 192–225 (1990) and as has become a standard practice in phased array imaging to improve SNR. This combination algorithm yields an essentially constant noise profile across the image, with varying signal (and hence varying SNR) that is enhanced in regions of significant overlap between component coil sensitivities. SMASH reconstruction, on the other hand, results in a constant-signal image with a varying noise profile. The linear combinations of component coil signals in SMASH are explicitly designed to produce a homogeneous composite signal. This is most obvious in the case of the zero$^{th}$ harmonic combination, which produces a flat net sensitivity profile $C^{tot}$ across the image plane. While the higher harmonics do involve significant spatial sensitivity variations, their profiles are all complex exponentials of unit modulus, and they do not lead to any intensity variations in the absolute magnitude image. (In other words, any apparent loss of sensitivity in the real channel is precisely compensated by a sensitivity gain in the imaginary channel.) SMASH reconstructions, therefore, do away with intensity peaks in regions of component coil overlap in favor of a spatially homogeneous image profile. Thus, sensitivity-dependent linear combinations may be used independently of SMASH as a method of homogeneity correction. A homogeneity-corrected version of the image in FIG. 6A may be generated by linear combination of component coil reference images, using the weights calculated for the zero$^{th}$ harmonic profile in FIG. 4A. Roemer et. al. have described an alternative combination agorithm for producing constant-signal images from phased arrays, and SMASH images produced with accurate spatial harmonics will have similar intensity profiles.

Such considerations of image intensity profiles are addressed primarily at the numerator of the signal-to-noise ratio. The behavior of noise in SMASH images is complicated by the presence of noise correlations among the variously combined data sets that enter into a SMASH reconstruction. Noise from each of the individual coils is replicated (albeit with different weights) in each of the different harmonic composite signals, and this might raise a concern that some portion of the noise voltages will add coherently. If the addition were purely coherent, i.e. if noise were to enter into each of the composite signals with identical weights, then the rms noise value would exceed the value for conventional full-time acquisitions by the square root of the number of composites. In other words, the upper limit of SNR loss due to noise correlations is the square root of the time savings factor. In practice, however, the signal combinations are formed with distinct sets of complex weights, which reduces noise correlations substantially below this theoretical limit.

Dependence on Component Coil Sensitivities

In the above described embodiment, the SMASH imaging technique depends upon the measurement and manipulation of coil sensitivities for its spatial harmonic generation. Errors in spatial harmonics may lead to aliasing artifacts and SNR degradation (for example due to mismatch and mixing between the spatial frequency components of the image). This raises several practical issues. First, we must be able to estimate coil sensitivities with some reasonable degree of accuracy. Sensitivity maps from phantom images were used for the SMASH reconstructions presented here. As noted above, numerical simulations of coil sensitivity may also be used, if these simulations have been reliably calibrated. The invention has also implemented use of other techniques for direct sensitivity estimation, including in vivo estimation using fast low resolution scans at the time of in vivo imaging. Low-pass-filtering of images could also be used to provide sensitivity maps. These techniques may be automated for calibrating sensitivities and deriving weights for creating the composite signals.

Another detail to be addressed is that $B_0$ and $B_1$ magnetic field inhomogeneities may distort the true coil sensitivity profiles and interfere with spatial harmonic generation. Spin echo sequences, like the TSE sequence used in this work, have the advantage of refocusing static field inhomogeneities. Gradient echo sequences have been found to perform just as well. The weight-finding algorithm used by applicant automatically compensated for some degree of residual field inhomogeneity and generated accurate spatial harmonics even in the presence of systematic phase or intensity erors. In fact the technique has been found to be directly applicable not only to spin echo sequences such as TSE but also to several variants of gradient echo sequences including FISP and standard GRE.

Finally, the geometry of the coil array will place certain limitations on the field of view, the position, and the angulation of image planes suitable for SMASH reconstruction. Surface coil sensitivity profiles vary with distance from the coil center, and while simulations indicate that a wide range of image plane geometries are compatible with SMASH reconstruction, the reconstruction may begin to fail at large distances and angles, where sensitivity functions become broad and asymmetric. These constraints will be relaxed in the presence of larger numbers of component coils whose sensitivities provide good coverage of the imaged volume. The design of RF coil arrays specifically tailored for accurate and flexible spatial harmonic generation will help to overcome the limitations outlined above.

In particular, the invention contemplates the use of coil arrays with multiple component coils extending in more than one linear direction. A two-dimensional array, such as an N xM rectangular array, will allow generation of spatial harmonics along multiple directions and will relax constraints on image plane position and angulation. Wraparound arrays are also contemplated to allow spatial harmonic generation in a plane transverse to the body plane. A coil arrangement with a surface array on the top of the body and another surface array on the bottom, possibly with some linear offset with respect to one another, will allow fine tuning of spatial harmonics in a plane between the two and will have the added advantage of increasing overall SNR in such a plane. An extended grid coil may also be designed with a sensitivity profile more closely approximating a sinusoid. All such multiple-coil configurations will allow improvement in the accuracy of spatial harmonic generation, as well as allowing a greater number and variety of harmonics to be generated. As in the prototype embodiment described, the component coils in these arrays may be overlapped and may be output to low input impedance preamplifiers as necessary, to minimize inductive coupling. It is also possible that the simple expedient of transforming the coil sensitivities to achieve the spatial harmonic reconstruction procedure of applicant's SMASH invention may be applied in large arrays of coils of the sort proposed by Hutchinson and Raff in 1988 and described further by Kwiat, Einav and Navon, supra.

It should be observed that, although recent studies have shown that the sensitivity advantages of phased arrays peak at coil numbers less than 10, the advantages of faster imaging with SMASH imaging may be further enhanced by arrays with larger numbers of coils and with new coil geometries. As one may intuit from FIGS. 3 and 4A, the higher the frequency of the spatial harmonic desired, the larger the number of component coils that will be required for its generation. This is in part because, at least for simple component coil shapes, the sharpest features of the net sensitivity function can only be on the order of the component coil dimension. As noted above, the extra sensitivity information from additional coils can also be used for the fine tuning of spatial harmonics and the improvement of image quality.

The SMASH technique as applied to a conventional NMR apparatus described above partially replaces gradient phase encoding by a spatial encoding procedure tied to the detection coils, in which some of the spatial modulations that distinguish different phase-encoding lines are generated by combining signals from multiple coils arrayed above or around the imaging volume. This shift of responsibility from gradient geometry to coil geometry, and from the spin preparation stage to the stage of signal detection and combination, allows for simultaneous acquisition of multiple lines of k-space. Enhancement of image speed, resolution or field of view by a factor of two, five, ten or more may be expected with appropriate coil arrays generating sufficient harmonics.

Apart from its promise for progressively faster acquisitions, SMASH has a number of practical advantages as a fast imaging scheme. As a partially parallel acquisition strategy, it can be combined with most existing sequential fast imaging techniques for multiplicative time savings. No special hardware is required, other than an Appropriate coil array.

One embodiment of the invention includes a coil array together with a digital signal processor configured to combine the outputs of the component coils with appropriate weights as described above, and produce two or more output signals, each of which represents a composite spatial harmonic as described above. The array with processor may then be directly substituted for a conventional receiving coil, with the difference that it produces two or more lines of data for each spin conditioning cycle of the MRI apparatus. As such, the plug-in coil unit may operate with older MRI devices to directly enhance the acquisition time, field of view, or resolution by a factor of two or more, without changing the expensive magnet and other spin conditioning hardware of the device. Commercially available or home-built MR phased arrays may well suffice to yield significant time savings, and SMASH may be performed on machines not equipped with much more costly magnetic enhancements such as EPI gradient systems. Combination of the component coil signals may be performed after the fact, allowing for a wide range of postprocessing steps, including fine tuning of spatial harmonics, adaptive artifact correction, or even non-Fourier (e.g. wavelet) encoding and reconstruction. Furthermore, it should be noted that the invention further contemplates that both for constructing the basic component coil transforms or weights and for any tuning or adaptive adjustments, the invention may include a digital signal processor or neural network processor in addition to the normal complement of control and processing assemblies in conventional apparatus to evaluate the responses or coil signals and carry out the signal combination into spatial harmonics in real time. Even in the simplest embodiments, spatial harmonic reconstructions automatically yield a homogeneous intensity profile for the reconstructed image, and this may be advantageous for some imaging applications.

The time gained in a SMASH acquisition may be used to collect extra data for better spatial resolution and/or SNR, or else faster acquisitions may be used to eliminate motion artifacts from mobile structures in the field of view The invention has been described above with reference to a prototype embodiment which produces signals corresponding to spatial harmonics that yield additional k-space lines equivalent to the conventional gradient steps in a Fourier transform imaging system and a simple coil array and processing assembly for enhancing image speed, quality or field. However, the method is broadly applicable to coils and processors for producing various spatial representations, including wavelets or other non-Fourier spatial representations to replace, supplement or enhance MR imaging processes and systems. The invention being thus described, further variations and modifications will occur to those skilled in the art, and all such variations and modifications are considered to be within the scope of the invention and its equivalents, as set forth in the claims appended hereto.

What is claimed is:

1. A method of magnetic resonance imaging of a continuous region of a body by conditioning nuclear spins and measuring RF signals indicative of the conditioned spins, wherein the method includes performing multiple steps of spin conditioning and of collecting of RF measurement signal responses from the region, establishing an ordered data set of collected RF signals, and performing a spatial transformation of the ordered data set to produce a magnetic resonance image of said region, wherein the method includes the steps of 1) for a spin conditioning step
   i) receiving an RF measurement signal response simultaneously in each of plural RF receiving coils which each have a different spatial sensitivity, thereby acquiring a plurality of response signals
   ii) forming at least two distinct combinations of said plurality of response signals, including a first combination signal and one or more remaining combination signals
   iii) applying said first combination signal to an entry of said ordered data set that corresponds to said spin conditioning step, and applying the remaining combination signals to fill further entries of said ordered data set which are offset from said entry that corresponds to the spin conditioning step,
2) performing additional spin conditioning steps and repeating steps i)–iii) for each additional spin conditioning step to thereby fill said ordered data set while reducing spin conditioning steps performed, and
3) performing a spatial transformation of the filled and ordered data set into a magnetic resonance image of said continuous region thereby imaging said continuous region with reduced data acquisition time.

2. A method according to claim 1, wherein the spin conditioning steps include steps of applvini at least one of RF pulses and magnetic field gradients and said steps of receiving and combining are carried out to form images of a given field of view and spatial resolution while reducing at least one of number or duration of spin conditioning steps performed and thereby reducing image acquisition time.

3. A method according to claim 1, wherein said steps of receiving and combining are carried out to form images in which at least one of field of view and spatial resolution is enhanced for a given acquisition time.

4. A method according to claim 1, wherein the step of combining combines the measurement signal responses in linear combinations with complex coefficients.

5. A method according to claim 1, wherein the steps of combining are performed after performing all the spin conditioning steps.

6. A method according to claim 1 further comprising the step of mapping sensitivity of said plural coils to determine coefficients for combining the response signals into said combination signals.

7. A method according to claim 1, wherein the spin conditioning and measurement are performed by at least one of spin echo, gradient echo and BURST style imaging techniques.

8. A method according to claim 1, wherein the step of forming combinations forms combination signals corresponding to non-Fourier spatial distributions, and the step of performing a spatial transformation applies a corresponding non-Fourier transformation to form the magnetic resonance image.

9. A method according to claim 1, wherein the step of forming combinations forms wavelet combination signals corresponding to spatially orthogonal data, and the step of performing a spatial transformation applies a wavelet transform to transform the filled ordered data set into the image.

10. A method according to claim 1, wherein the step of forming combinations of said response signals forms combinations corresponding to spatial harmonics, and the step of performing a spatial transformation applies a Fourier transformation to form the magnetic resonance image.

11. A method according to claim 10, wherein the step of forming combinations of said response signals forms M spatial harmonic combinations, where M is an integer greater than 2, and reduces spin preparation required for signal acquisition by a factor of M.

12. A method of imaging a region of a body by MR by capturing MRI data during multiple cycles of NMR spin conditioning and measurement, said method comprising the steps of:

i) during one spin conditioning cycle receiving an NMR RF measurement signal response simultaneously in each of plural surface coils having different spatial sensitivities, ii) combining said NMR RF measurement signal responses received in the plural coils by linear combinations with complex coefficients into plural sets of composite NMR signals, each set of composite NMR signals containing different spatial information wherein the step of combining signal responses yields composite spatial sensitivities which approximate spatial harmonics of an imaged field of views iii) performing additional spin conditioning cycles and repeating said steps of receiving and combining to form a data set augmented by at least one set of said composite NMR signals, and iv) forming an MR image from said data set.

13. A method according to claim 12 in which the spatial harmonic composite signals are substituted for data lines corresponding to omitted increments in magnetic field gradients thereby reducing the number of gradient steps used to form an image.

14. A method according to claim 12 wherein the step of receiving in surface coils includes receiving in at least one of a two dimensional coil array, an N×M coil array, a wrap around coil array and an extended grid coil array.

15. A method according to claim 12, further comprising the step of mapping sensitivity of said plural coils to determine weights for combining the received NMR RF measurement signal responses into said sets of spatial harmonic composite NMR signals.

16. A method according to claim 12, wherein the cycles of spin conditioning and measurement are selected from among spin echo, gradient echo and BURST spin conditioning techniques.

17. A magnetic resonance imaging (MRI) apparatus of the type having a magnet for establishing a magnetic field, means for conditioning nuclear spins in a continuous region and means for collecting a signal response from the conditioned spins, said means for conditioning and said means for collecting being operated in repetitive cycles to collect signal responses in an ordered data set, and including a processor which applies a spatial transformation to the ordered data set to produce a magnetic resonance image having a characteristic resolution and field of view over said region, wherein the apparatus includes a plurality of coils for receiving said signal responses, the coils forming an array and each having a different spatial sensitivity so as to each receive a different signal response, and means for combining the signal responses received in one conditioning step in said plural individual coils of said array to form a plurality of distinct combination signals corresponding to independent spatial representations of spin data from said region, each of said plurality of distinct combination signals being applied to fill an entry of said ordered data set which is offset from other entries of said data set, and thereby filling said data set with multiple combination signals formed from the signal responses received in each conditioning step said processor applying a spatial transform to the filled ordered data set to thereby produce said image having the characteristic resolution and field of view over the region while reducing required spin conditioning.

18. A magnetic resonance imaging (MRI) apparatus according to claim 17, wherein said means for combining combines said signals in flow-through fashion as said signal responses are received in said coils.

19. A magnetic resonance imaging (MRI) apparatus according to claim 17, wherein said spatial representations include a non-Fourier representation.

20. A magnetic resonance imaging (MRI) apparatus according to claim 19 wherein said non-Fourier representations are wavelets.

21. A magnetic resonance imaging (MRI) apparatus according to claim 17, further comprising means for determining weights, and wherein said means for combining combines in accordance with weights determined by said means for determining.

22. A magnetic resonance imaging (MRI) apparatus according to claim 21, wherein said means for determining includes a stored table of weights for each of a plurality of imaging regions for forming said spatial representations.

23. A magnetic resonance imaging (MRI) apparatus according to claim 17, wherein said plurality of coils are surface coils which form an array having an extent of approximately twenty to about fifty centimeters, and individual coils of the array each have an extent under about twenty centimeters.

24. A magnetic resonance imaging (MRI) apparatus according to claim 17, wherein said plurality of coils form a linear array.

25. A magnetic resonance imaging (MRI) apparatus of the type having a magnet for establishing a magnetic field in a region, means for conditioning nuclear spins in the region and means for collecting an RF signal from the conditioned spins, said magnet and said means being operated in repetitive cycles to collect spin data and construct an image of material in said region, wherein said means for collecting an RF signal includes a plurality of surface coils forming an array, and each having a different spatial sensitivity, and means for combining signals from plural individual coils of said array with different weights into a plurality of sets of signals corresponding to orthogonal spatial representations of spin data from said region, wherein said spatial representations are spatial harmonics.

26. In a magnetic resonance imaging (MRI) apparatus of the type having a magnet for establishing a magnetic field in a continuous region, means for conditioning nuclear spins in the region and means for collecting a magnetic resonance response signal from the conditioned spins, said means for conditioning and said means for collecting being operated in repetitive cycles to collect response signals and construct a spatially ordered data set of signal data which is then transformed to form an image of material in said region, the improvement wherein said means for collecting a magnetic resonance response signal includes a plurality of surface coils forming an array, and each having a different spatial sensitivity, and the apparatus further includes means for combining signals from plural individual coils of said array with different weights so as to form a plurality of combination signals each corresponding to an independent spatial representation of spin data from said continuous region, and said apparatus applies said combination signals to fill offset entries of said spatially ordered data set to complete the data set with reduced spin conditioning and form said image.

* * * * *